United States Patent
Kikuchi et al.

(10) Patent No.: US 9,899,245 B2
(45) Date of Patent: Feb. 20, 2018

(54) CONVEYING METHOD AND SUBSTRATE PROCESSING APPARATUS

(71) Applicant: Tokyo Electron Limited, Tokyo (JP)

(72) Inventors: Hiroshi Kikuchi, Iwate (JP); Eiki Fujii, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 71 days.

(21) Appl. No.: 14/633,792

(22) Filed: Feb. 27, 2015

(65) Prior Publication Data

US 2015/0255319 A1 Sep. 10, 2015

(30) Foreign Application Priority Data

Mar. 4, 2014 (JP) ................................ 2014-042136

(51) Int. Cl.
*H01L 21/677* (2006.01)
*H01L 21/673* (2006.01)
*H01L 21/687* (2006.01)

(52) U.S. Cl.
CPC .. *H01L 21/67379* (2013.01); *H01L 21/67769* (2013.01); *H01L 21/68707* (2013.01); *H01L 21/6773* (2013.01)

(58) Field of Classification Search
CPC ............. H01L 21/773; H01L 21/67733; H01L 21/6773; Y10S 414/14
See application file for complete search history.

(56) References Cited

U.S. PATENT DOCUMENTS

| | | | | |
|---|---|---|---|---|
| 5,407,181 | A * | 4/1995 | Ohsawa | C23C 16/54 266/257 |
| 6,327,794 | B2 * | 12/2001 | Ishii | 34/408 |
| 6,726,429 | B2 * | 4/2004 | Sackett | H01L 21/67769 414/217 |
| 7,686,176 | B2 * | 3/2010 | Murata | B66C 1/28 212/332 |
| 8,851,819 | B2 * | 10/2014 | Kamikawa | H01L 21/67727 414/222.07 |
| 8,985,937 | B2 * | 3/2015 | Fukutomi | H01L 21/67766 414/805 |
| 2010/0215461 | A1 * | 8/2010 | Kamikawa | H01L 21/67727 414/222.13 |

FOREIGN PATENT DOCUMENTS

JP 2004-363363 A 12/2004

* cited by examiner

*Primary Examiner* — Mark C Hageman

(74) *Attorney, Agent, or Firm* — Abelman, Frayne & Schwab

(57) ABSTRACT

Provided is a method of conveying a storage container from a placing table to a conveyance place using a conveying mechanism in a substrate processing apparatus. The storage container hermetically stores a substrate and includes a flange portion formed on the top thereof. The conveying mechanism includes a hand portion provided with a flange insertion portion. The substrate processing apparatus is provided with at least two placing tables arranged side by side in a first horizontal direction. The method includes moving the placing table to the conveyance place in the second horizontal direction by a predetermined distance; sliding the hand portion from a side of a placing table neighboring to the placing table in the first horizontal direction such that the flange portion is inserted into the flange inserting portion; and conveying the storage container from the placing table to the conveyance place through the hand portion.

7 Claims, 11 Drawing Sheets

CONVEYING METHOD AND SUBSTRATE PROCESSING APPARATUS

CROSS-REFERENCE TO RELATED APPLICATIONS

This application is based on and claims priority from Japanese Patent Application No. 2014-042136, filed on Mar. 4, 2014, with the Japan Patent Office, the disclosure of which is incorporated herein in its entirety by reference.

TECHNICAL FIELD

The present disclosure relates to a conveying method and a substrate processing apparatus.

BACKGROUND

In fabricating a semiconductor device, substrate processings such as, for example, a film forming processing, an oxidization processing, a diffusion processing, and an annealing processing are performed on various substrates (e.g., a semiconductor wafer) which are processing target objects. A substrate processing apparatus for performing the substrate processings includes, for example, a placing table (load port) that carries a carrier storing a plurality of wafers into the processing apparatus, a holding table (front-opening interface mechanical standard (FIMS) port) that holds the carrier when the wafers stored in the carrier is conveyed to a wafer boat, and a storage shelf (stocker) that temporarily stocks the carrier.

In general, the carriers are conveyed in the substrate processing apparatus in a state where a flange portion provided at an upper portion of the carrier is grasped by a hand portion of a conveying mechanism (see, e.g., Japanese Patent Laid-Open Publication No. 2004-363363) or in a state where the carrier is placed on a kinematic pin provided in the conveying mechanism.

In carrying the wafers into the substrate processing apparatus, the carrier storing the wafers is first placed in the load port. Thereafter, the carrier is conveyed from the load port to the stocker or the FIMS port by the conveying mechanism. Then, the wafers are taken out from the carrier on the FIMS port and the wafers are subjected to various processings. Thereafter, the wafers are stored in the carrier again and carried out for a subsequent process.

SUMMARY

According to an aspect, the present disclosure provides a method of conveying a storage container from a placing table to a conveyance place using a conveying mechanism in a substrate processing apparatus. The storage container is configured to hermetically store a substrate and includes a flange portion formed on the top thereof. The conveying mechanism includes a hand portion provided with a flange insertion portion. The substrate processing apparatus is provided with at least two placing tables arranged side by side in a first horizontal direction to be movable horizontally in a second horizontal direction perpendicular to the first horizontal direction. The conveyance place is provided to be spaced apart from the placing table in the second horizontal direction. The method comprising: moving the placing table, on which the storage container to be conveyed is placed, to the conveyance place in the second horizontal direction by a predetermined distance; sliding the hand portion from a side of a placing table neighboring to the placing table, on which the storage container to be conveyed is placed, in the first horizontal direction such that the flange portion is inserted into the flange inserting portion; and conveying the storage container from the placing table to the conveyance place through the hand portion.

The foregoing summary is illustrative only and is not intended to be in any way limiting. In addition to the illustrative aspects, embodiments, and features described above, further aspects, embodiments, and features will become apparent by reference to the drawings and the following detailed description

DETAILED DESCRIPTION

Figure 1:
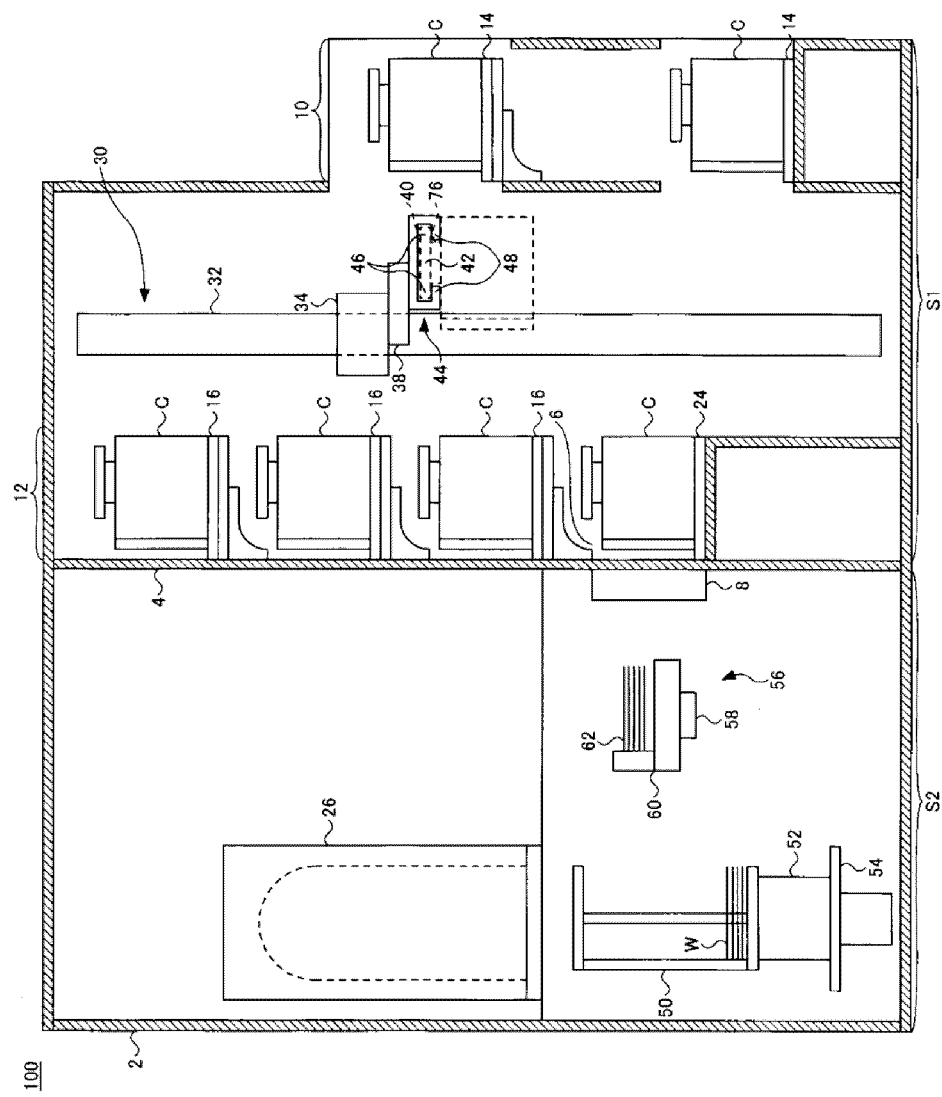
FIG. 1 is a schematic view illustrating an exemplary substrate processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In recent years, in order to increase a chip size or improve productivity, large-diameter size semiconductor wafers have been developed. With a large diameter of the semiconductor wafer, a weight of the semiconductor wafer is also increased, and as a result, a bending degree of an arm portion of the conveying mechanism is increased at the time of conveying the carrier. Therefore, there is a problem that the size and the weight of the conveying mechanism are increased in order to improve rigidity of the conveying mechanism.

Therefore, the present disclosure provides a conveying method which can convey a carrier storing a substrate by a light-weight conveying mechanism.

According to an aspect, the present disclosure provides a method of conveying a storage container from a placing table to a conveyance place using a conveying mechanism in a substrate processing apparatus. The storage container is configured to hermetically store a substrate and includes a flange portion formed on the top thereof. The conveying mechanism includes a hand portion provided with a flange insertion portion. The substrate processing apparatus is provided with at least two placing tables arranged side by side in a first horizontal direction to be movable horizontally in a second horizontal direction perpendicular to the first horizontal direction. The conveyance place is provided to be spaced apart from the placing table in the second horizontal direction. The method comprising: moving the placing table, on which the storage container to be conveyed is placed, to the conveyance place in the second horizontal direction by a predetermined distance; sliding the hand portion from a side of a placing table neighboring to the placing table, on which the storage container to be conveyed is placed, in the first horizontal direction such that the flange portion is inserted into the flange inserting portion; and conveying the storage container from the placing table to the conveyance place through the hand portion.

In the above-mentioned method, the conveying of the storage container includes: moving the storage container upwards from the placing table by lifting the hand portion; and after the moving of the storage container upwards, sliding the hand portion from the placing table, on which the storage container to be conveyed is placed, to the neighboring placing table by a predetermined distance in the first horizontal direction.

The above-mentioned method further includes, after the conveying of the storage container, sliding the hand portion from the placing table, on which the storage container to be conveyed is placed, to the neighboring placing table by a predetermined distance in the first horizontal direction to release engagement of the hand portion with respect to the flange portion.

In the above-mentioned method, the hand portion includes, on the bottom thereof, an engagement unit configured to engage with a bottom of the inserted flange portion.

In the above-mentioned method, the substrate processing apparatus includes a substrate conveying region and a container conveying region which are partitioned by a partition wall having one or more conveyance ports in the first horizontal direction; a holding table provided to correspond to the conveyance ports in the container conveying region and configured to hold the storage container to deliver the substrate stored in the storage container from the container conveying region to the substrate conveying region through the conveyance ports, and a storage shelf provided above the holding table and configured to store the storage container.

In the above-mentioned method, the conveyance place is any one of the holding table and the storage shelf.

In the above-mentioned method, the storage container includes a positioning groove on the bottom, and the placing table, the holding table, and the storage shelf include a positioning pin that engages with the positioning groove.

In the above-mentioned method, the conveying mechanism includes a first guide portion provided between the conveyance place and the placing table and extending in a vertical direction; a second guide portion connected to the first guide portion to be movable in the vertical direction and extending in the first horizontal direction; a moving portion connected to the second guide portion to be movable in the first horizontal direction; and an arm portion provided in the moving portion. The hand portion is provided at a front end of the arm portion.

According to another aspect, the present disclosure provides a substrate processing apparatus including a substrate conveying region and a container conveying region which are partitioned by a partition wall having one or more conveyance ports in a first horizontal direction; a holding table provided to correspond to the conveyance ports in the container conveying region and configured to hold a storage container which hermetically stores a substrate and has a flange portion on the top thereof to deliver the substrate stored in the storage container from the container conveying region to the substrate conveying region through the conveyance ports; a storage shelf provided above the holding table and configured to store the storage container; at least two placing tables provided in the container conveying region to be spaced apart from each other in line in a first horizontal direction and a second horizontal direction perpendicular to a vertical direction and arranged side by side at least in the first horizontal direction to be movable horizontally to the holding table; a conveying mechanism including a first guide portion provided between the holding table and the placing table and extending in a vertical direction, a second guide portion connected to the first guide portion to be movable in the vertical direction and extending in the first horizontal direction, a moving portion connected to the second guide portion to be movable in the first horizontal direction, an arm portion provided in the moving portion and stretchable in the second horizontal direction, and a hand portion provided at a front end of the arm portion and having a flange inserting portion; and a control unit configured to control operations of the conveying mechanism. The control unit controls the conveying mechanism to perform the operations of: moving the placing table placing, on which the storage container to be conveyed is placed, to the holding table in the second horizontal direction by a predetermined distance; sliding the hand portion from a side of a placing table neighboring to the placing table placing the storage container to be conveyed in the first horizontal direction such that the flange portion is inserted into the flange inserting portion to engage the flange portion with the hand portion; and conveying the storage container from the placing table to the holding table or the storage shelf through the hand portion.

According to still another aspect, the present disclosure provides a method of conveying a storage container from a first placing table to at least two second placing tables using a conveying mechanism in a substrate processing apparatus. The storage container is configured to hermetically store a substrate and includes a flange portion formed on the top thereof. The conveying mechanism includes a hand portion provided with a flange inserting portion. The at least two placing tables is arranged side by side in a first horizontal direction to be movable horizontally in a second horizontal direction perpendicular to the first horizontal direction, and the first placing table is provided to be spaced apart from the second placing tables in the second horizontal direction. The method includes sliding the hand portion in the first horizontal direction such that the flange portion is inserted into the flange inserting portion with respect to a storage container to be conveyed, which is placed on the first placing table; moving a second placing table conveying the storage container to the first placing table in the second horizontal direction by a predetermined distance; moving the storage container from the first pacing table to the moved second placing table through the hand portion; sliding the hand portion to a second placing table neighboring to the second placing table, on which the storage container to be conveyed is placed, in the first horizontal direction such that the flange portion is separated from the flange inserting portion; and moving the second placing table, on which the storage container to be conveyed is placed, in a direction opposite to the first placing table in the second horizontal direction by the predetermined distance.

According to yet another aspect, the present disclosure provides a substrate processing apparatus including a substrate conveying region and a container conveying region which are partitioned by a partition wall having one or more conveyance ports in a first horizontal direction; a holding table provided to correspond to the conveyance ports in the container conveying region and configured to hold a storage container to deliver the substrate stored in the storage container from the container conveying region to the substrate conveying region through the conveyance ports, the storage container being configured to hermetically store a substrate and including a flange portion formed on the top thereof; a storage shelf provided above the holding table and configured to store the storage container; at least two placing tables provided in the container conveying region to be spaced apart from each other in line in a first horizontal direction and a second horizontal direction perpendicular to a vertical direction and arranged side by side at least in the first horizontal direction to be movable horizontally to the holding table; a conveying mechanism including a first guide portion provided between the holding table and the placing table and extending in a vertical direction, a second guide portion connected to the first guide portion to be movable in the vertical direction and extending in the first horizontal direction, a moving portion connected to the second guide portion to be movable in the first horizontal direction, an arm portion provided in the moving portion and stretchable in the second horizontal direction, and a hand portion provided at a front end of the arm portion and having a flange inserting portion; and a control unit controlling operations of the conveying mechanism. The control unit controls the conveying mechanism to perform the operations of: sliding the hand portion in the first horizontal direction such that the flange portion is inserted into the flange inserting portion with respect to a storage container to be conveyed, which is placed on the storage shelf or the holding table; moving a second placing table conveying the storage container to the storage shelf or the holding table in the second horizontal direction by a predetermined distance; moving the storage container from the storage shelf or the holding table to the moved placing table through the hand portion; slidably moving the hand portion to a placing table neighboring to the placing table, on which the storage container to be conveyed is placed, in the first horizontal direction such that the flange portion is separated from the flange inserting portion; and moving the placing table placing the storage container to be conveyed in a direction opposite to the storage shelf and the holding table in the second horizontal direction by the predetermined distance.

According to the present disclosure, a conveying method can be provided which can convey a carrier storing a substrate by a light-weight conveying mechanism.

Hereinafter, exemplary embodiments of the present disclosure will be described with reference to the accompanying drawings.

(Substrate Processing Apparatus)

Figure 2:
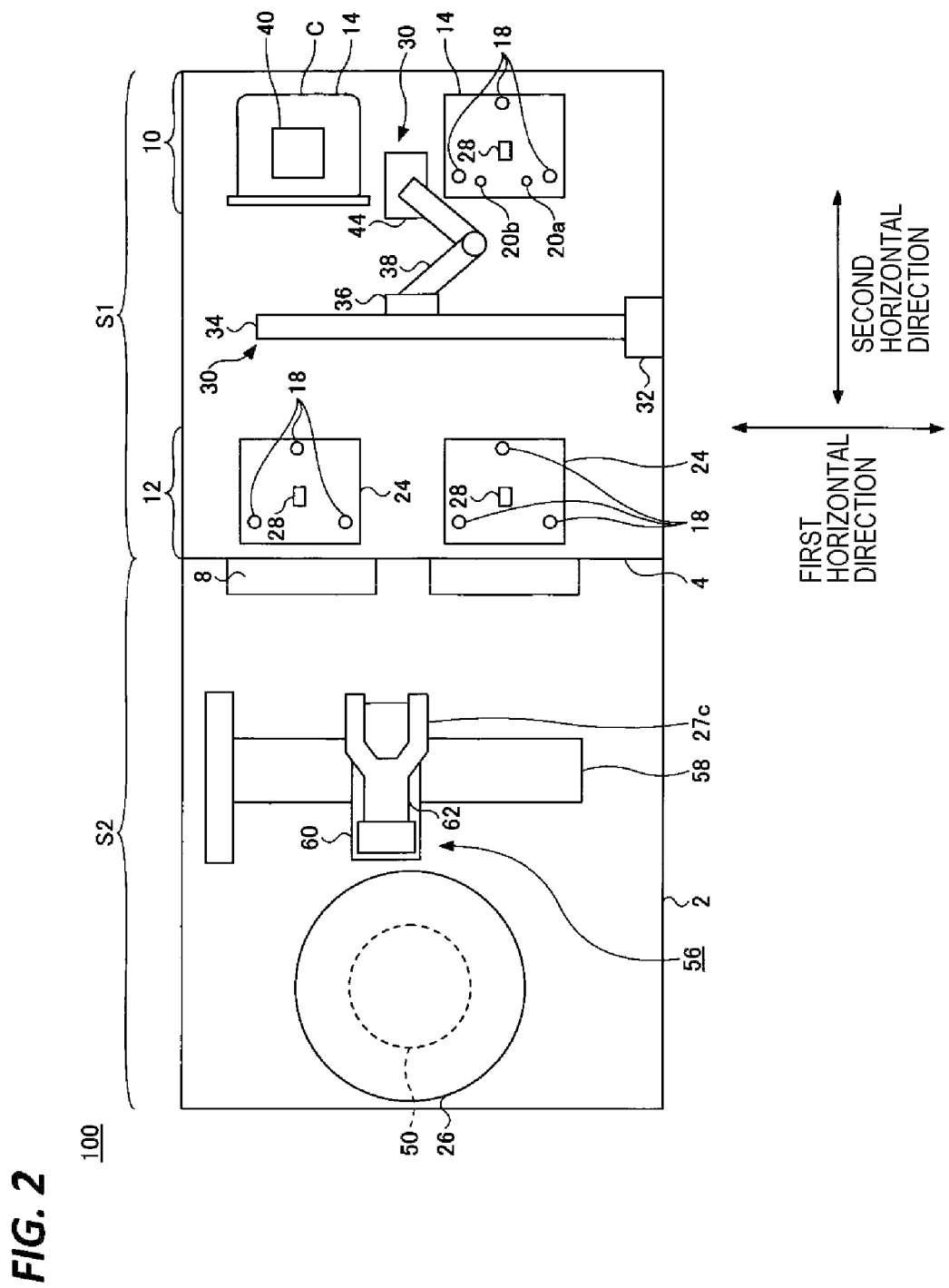
FIG. 2 is a schematic plan view illustrating the substrate processing apparatus according to the exemplary embodiment.
Figure 3:
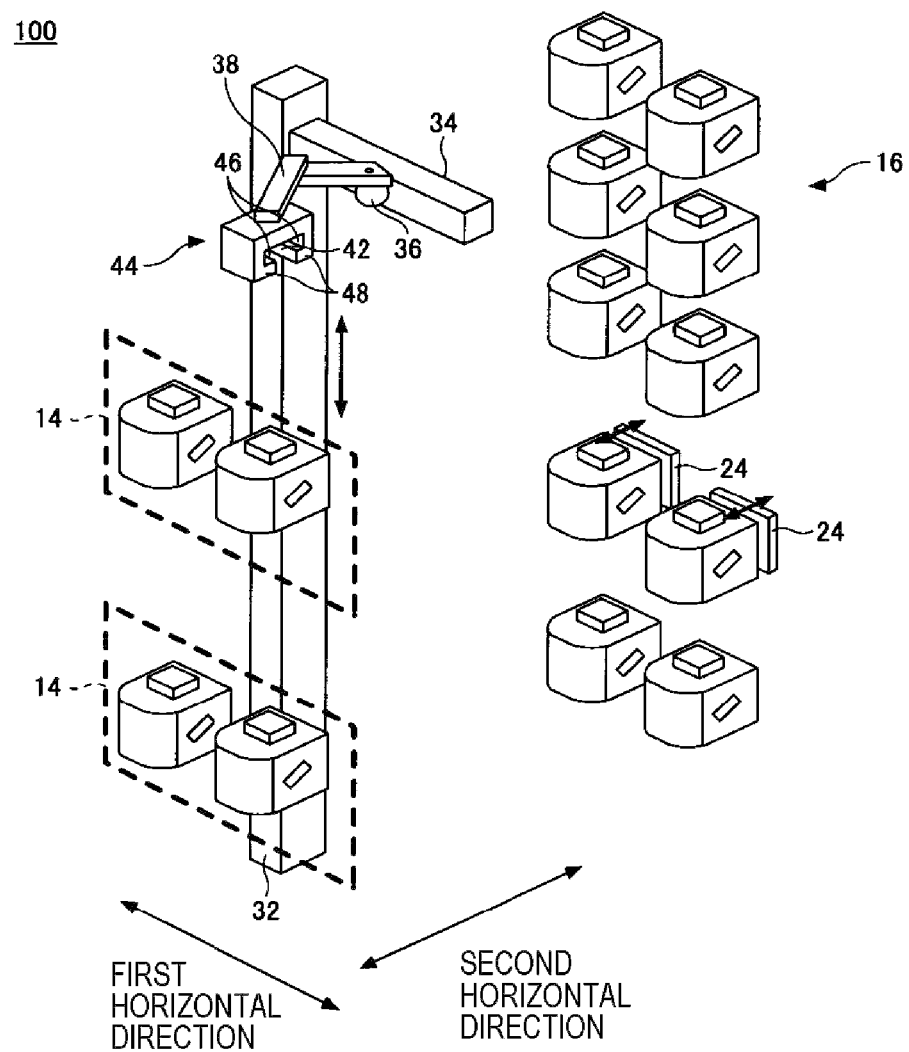
FIG. 3 is a schematic perspective view illustrating an exemplary carrier conveying region according to the exemplary embodiment.

First, a configuration example of a substrate processing apparatus that may perform a conveying method according to an exemplary embodiment will be described. FIG. 1 is a schematic view illustrating an exemplary substrate processing apparatus according to an exemplary embodiment. Further, FIG. 2 is a schematic plan view illustrating the substrate processing apparatus according to the exemplary embodiment. In addition, FIG. 3 is a schematic perspective view illustrating an exemplary carrier conveying region according to the exemplary embodiment. Moreover, for the purpose of explanation, FIG. 2 illustrates a state where a carrier C is not placed at one side of a load port 14 and an FIMS port 24 of FIG. 1.

Further, the conveying method according to the exemplary embodiment may be applied to various substrate processing apparatuses in addition to a longitudinal heat treatment apparatus. However, for ease of understand, in the exemplary embodiment, the conveying method will be described by an example performed using the longitudinal heat treatment apparatus as a specific substrate processing apparatus.

As illustrated in FIG. 1, the substrate processing apparatus 100 is accommodated in a case 2 constituting an exterior body of the apparatus. A carrier conveying region S1 where carriers C serving as containers accommodating semiconductor wafers W (hereinafter, referred to as "wafers W") serving as processing target objects are carried in and out of the apparatus, and a wafer conveying region S2 where the wafers W in the carriers C are conveyed and carried into a heat treatment furnace 26 (to be described below are formed in the case 2.

The configuration of the carriers C will be described later in detail. When a wafer W is conveyed, in order to prevent attachment of foreign substances or formation of a natural oxide film onto the surface of the wafer W, the semiconductor wafer is accommodated in a substrate storage container called a front-opening unified pod (FOUP) and the cleanliness in the container is maintained to a predetermined level.

The carrier conveying region S1 and the wafer conveying region S2 are partitioned by a partition wall 4. The carrier conveying region S1 is a region under an air atmosphere and a region where the carriers C storing the wafers W are conveyed among parts (to be described below) in the substrate processing apparatus 100, and are carried in the substrate processing apparatus 100 from the outside or carried out to the outside from the substrate processing apparatus. Meanwhile, the wafer conveying region S2 is a region where various processings are performed by taking out the wafers W from the carriers C and is under an inert gas atmosphere, for example, a nitrogen ($N_2$) gas atmosphere in order to prevent an oxide film from being formed on the wafers W. In a description given below, arrangement direction of the carrier conveying region S1 and the wafer conveying region S2 is set to a forward-backward direction (corresponding to a second horizontal direction to be described below), in which the carrier conveying region S1 side is set to a forward direction and the wafer conveying region S2 side is set to a backward direction. In addition, a horizontal direction perpendicular to the forward-backward direction is set to a left-right direction (corresponding to a first horizontal direction to be described below).

Further, a filter unit such as a HEPA filter or an ULPA filter (not illustrated) may be provided on a ceiling portion of the wafer conveying region S2 and air cleaned by the filter may be supplied thereto.

Conveyance ports 6 are formed on the partition wall 4 to convey the wafers W between the carrier conveying region S1 and the wafer conveying region S2. The conveyance ports 6 are opened/closed by a door mechanism 8 according to a front-opening interface mechanical standard (FIMS).

The carrier conveying region S1 will be described. The carrier conveying region S1 is constituted by a first conveying region 10 and a second conveying region 12 positioned at a rear side of the first conveying region 10.

As an example, as illustrated in FIG. 1, two tiers are provided vertically in the first conveying region 10, and two load ports 14 are provided horizontally on each tier (see, e.g., FIG. 2). Each load port 14 is a carry-in placing table receiving the carrier C when the carrier C is carried into the substrate processing apparatus 100.

The load ports 14 are provided at locations where a wall of the case 2 is opened, and enables access to the substrate processing apparatus 100 from the outside. Specifically, carry-in and placement of the carriers C onto the load ports 14 and carry-out of the carriers C to the outside from the load ports 14 are enabled by a conveying apparatus (not illustrated) provided outside the substrate processing apparatus 100 according to the exemplary embodiment. Further, since the load ports 14 are provided, for example, on two upper and lower tiers, the carry-in and the carry-out of the carriers C at both tiers are enabled.

Further, stockers 16 (to be described below) may be provided at locations of the first conveying region 10 where the load ports 14 on two upper and lower tiers do not exist in order to store a lot of carriers C.

As illustrated in FIG. 2, positioning pins 18 are provided, for example, at three locations on a placement surface of each carrier C of each load port 14 to position the carriers C. Further, in a state where the carrier C is at least placed on the load port 14, the load port 14 is configured to be movable in the forward-backward direction.

As illustrated in FIG. 2, a supply nozzle 20a and an exhaust nozzle 20b may be provided in the load port 14. An intake port 22a and an exhaust port 22b (see FIG. 4B to be described below) are generally provided on a bottom surface of the carrier C and in the load port 14. When the carrier C is placed, the supply nozzle 20a may be provided at a location corresponding to the intake port 22a of the carrier C, and the exhaust nozzle 20b may be provided at a location corresponding to the exhaust port 22b of the carrier C. Since the supply nozzle 20a and the exhaust nozzle 20b are provided, inert gas may be supplied into the carrier C to replace nitrogen in the carrier C when the carrier C is placed on the load port 14. Therefore, a space is filled with the inert gas, but in a step in which the carrier C conveyed without supplying the inert gas is carried in the load port 14, the supply of the inert gas may be immediately resumed.

Two FIMS ports 24 are placed in a line in the left-right direction at a lower side of the second conveying region 12. The FIMS ports 24 are holding tables that hold the carriers C when the wafers W in the carriers C are carried in and out of the heat treatment furnace 26 (to be described below) in the wafer conveying region S2. The FIMS ports 24 are configured to move in the forward-backward direction. As illustrated in FIG. 2, the positioning pins 18 positioning the carriers C are provided, for example, at three locations even on a placement surface of each FIMS ports 24, similarly to the load ports 14. Further, a hook 28 for fixing a carrier C is provided on the placement surface of the FIMS port 24.

The stocker 16 stocking the carrier C is provided at an upper side of the second conveying region 12. The stocker 16 is constituted by two or more tiers (three tiers in the example illustrated in FIG. 1) of shelves, and two or more carriers C may be placed on each shelf in the left-right direction. Further, the stocker 16 may be placed even at a region where the carrier placing table is not placed as the lower side of the second conveying region 12.

The aforementioned supply nozzle 20a and exhaust nozzle 20b may be provided even on a bottom surface of the stocker 16 in the same manner as in the load port 14, and the inside of the carrier C placed on the stocker 16 may be replaced with an inert gas.

A carrier conveying mechanism 30 is provided between the first conveying region 10 and the second conveying region 12 to convey the carrier C among the load port 14, the FIMS port 24, and the stocker 16.

As illustrated in FIG. 2, the carrier conveying mechanism 30 includes a first guide portion 32 extending in an upward-downward direction, a second guide portion 34 extending in the left-right direction (first horizontal direction) in connection with the first guide portion 32, a moving portion 36 that moves in the left-right direction while being guided to the second guide unit 34, and a (multi) joint arm portion 38 (two arm portions having one joint in the example illustrated in FIG. 2) provided in the moving portion 36.

Further, as illustrated in FIG. 1, a hand portion 44 is provided at a front end of the multi-join arm portion 38 and includes a flange inserting portion 42 into which i a flange portion 40 (to be described below) of the carrier C may be inserted to engage the flange portion 40. More specifically, in the exemplary embodiment, a cross-section of the hand portion 44 may have a substantially C-shaped as illustrated in the example of FIG. 1. That is, a pair of concave portions 46 extends at both sides of the flange inserting portion 42. In addition, a pair of engaging portions 48 constituting lateral surfaces of the pair of concave portions 46 is formed at a lower end of the hand portion 44 to engage the flange portion 40. The pair of latch portions 48 is configured in such a manner that the top surface thereof supports the bottom surface of the flange portion 40 to support the flange portion 40. As a result, a distance between the engaging portions 48 that face each other is designed to be slightly larger than the width of a head portion 76 (to be described below) of the carrier C, and the width of the flange inserting portion 42 is designed to be slightly larger than the width of the flange portion 40 of the carrier C. Alternatively, a component that engages with the flange portion 40 may be provided at the latch portion 48 to position with the flange portion 40 of the carrier C.

As described above, the conveyance ports 6 of the wafers W are formed on the partition wall 4 to communicate the carrier conveying region S1 and the wafer conveying region S2. The door mechanism 8 is provided at the conveyance ports 6 to block the conveyance ports 6 from the wafer conveying region S2 side. A driving mechanism (not illustrated) is connected to the door mechanism 8. The door mechanism 8 is configured to move in the forward-backward direction and the upward-downward direction by the driving mechanism to open/close the conveyance ports 6.

Next, the wafer conveying region S2 will be described.

The vertical heat treatment furnace 26 of which a lower end is opened as a furnace opening is provided in the wafer conveying region S2. At a lower side of the heat treatment furnace 26, a wafer boat 50 is placed on a cover 54 through a heat insulating tube 52 to hold multiple wafers W in a shelf shape. In other words, the cover 54 is provided at a lower side of the wafer boat 50 integrally with the wafer boat 50.

The cover 54 is supported on a lift mechanism (not illustrated), and the wafer boat 50 is carried in or out of the heat treatment furnace 26 by the lift mechanism.

The wafer boat 50 is made of, for example, quartz and is configured to mount wafers W having a large diameter, for example, a diameter of 450 mm or 300 mm in a horizontal state in the upward and downward direction at a predetermined interval. In general, the number of wafers W accommodated in the wafer boat 50 is not limited, but may be, for example, approximately 50 to 150.

Further, a wafer conveying mechanism 56 is provided between the wafer boat 50 and the conveyance hole 6 of the partition wall 4. As illustrated in FIG. 2, the wafer conveying mechanism 56 is used to convey the wafer W between the carrier C held on the FIMS port 24 and the wafer boat 50. The wafer conveying mechanism 56 moves along a guide mechanism 58 extending in the left-right direction and is configured by providing five retractable forks 62 (conveyance plates) in a moving object 60 that pivots around a vertical axis.

(Carrier)

Next, a configuration of the carrier C will be described with reference to FIGS. 4A and 4B.

Figure 4A:
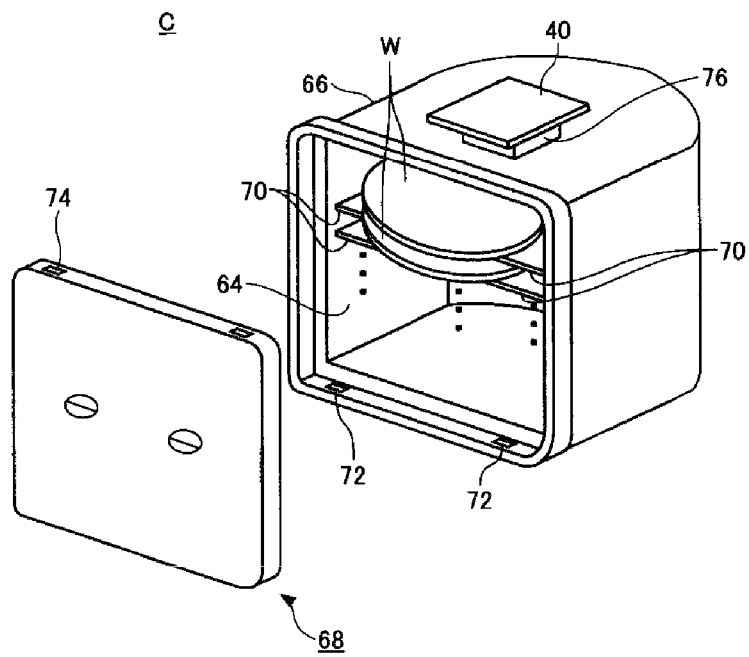
FIGS. 4A and 4B are schematic views illustrating an exemplary carrier.

FIG. 4A is a schematic perspective view of an example of the carrier C. Further, FIG. 4B is a schematic view of an example of a bottom surface of the carrier C.

The carrier C primarily includes a storage container body 66 having an opening 64 formed on one side and a cover 68 sealing the opening 64.

The opening 64 formed in the storage container body 66 is used to carry in and out the wafer W. The opening 64 is provided on a surface that faces the conveyance hole 6 when the opening 64 is disposed on the side of the storage container body 66 or the FIMS port 24.

Supports 70 (teeth) are provided at the left and right sides in the storage container body 66 in multiple tiers to support a rear surface of the wafer W.

Engaging grooves 72 are formed in an inner periphery of the opening 64 of the storage container body 66, and engaging portions 74 of the cover 68 engage with the engaging grooves 72, so that the cover 68 is fixed to the storage container body 66.

For example, a rectangular head portion 76 is formed on the top of the carrier C, and the flange portion 40 protruding in a rectangular shape is formed on the top of the head portion 76. The aforementioned carrier conveying mechanism 30 conveys the carrier C while the engaging portion 48 of the hand portion 44 supports a bottom surface of the flange portion 40. Further, the flange portion 40 may have a shape to be easily positioned with the hand portion 44.

Figure 4B:
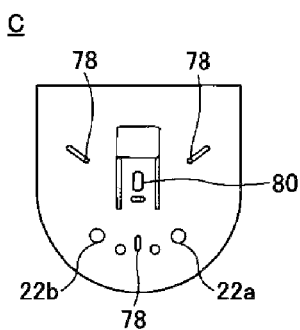

As illustrated in FIG. 4B, one or more positioning grooves 78 are formed on the bottom surface of the carrier C. As described above, the positioning pins 18 are formed in the load port 14, the stocker 16, and the FIMS port 24 to engage with the positioning grooves 78, respectively. When the carrier C is placed in the load port 14, the stocker 16, or the FIMS port 24, the carrier C is positioned at a predetermined location by the positioning pins 18 and the positioning grooves 78. Further, FIG. 4B illustrates an example in which three positioning grooves are formed, but the number is not limited thereto.

On the bottom surface of the carrier C, a groove 80 is formed at a location corresponding to the hook 28 which is formed on the placement surface of the FIMS port 24 to fix the carrier C. The groove 80 engages with the hook 28, so that the carrier C is fixed to the FIMS port 24.

(Conveying Method)

Next, a conveying method using the substrate processing apparatus 100 according to the exemplary embodiment, more specifically, a conveying method of the carrier C by the carrier conveying mechanism 30 will be described with reference to the accompanying drawings.

Figure 5A:
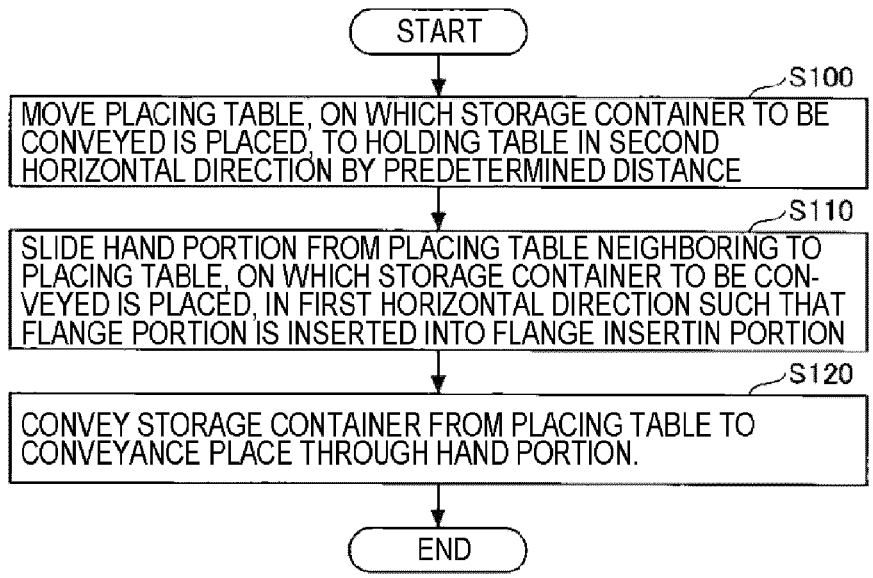
FIGS. 5A and 5B are flow charts of an exemplary conveying method according to an exemplary embodiment of the present disclosure.
Figure 5B:
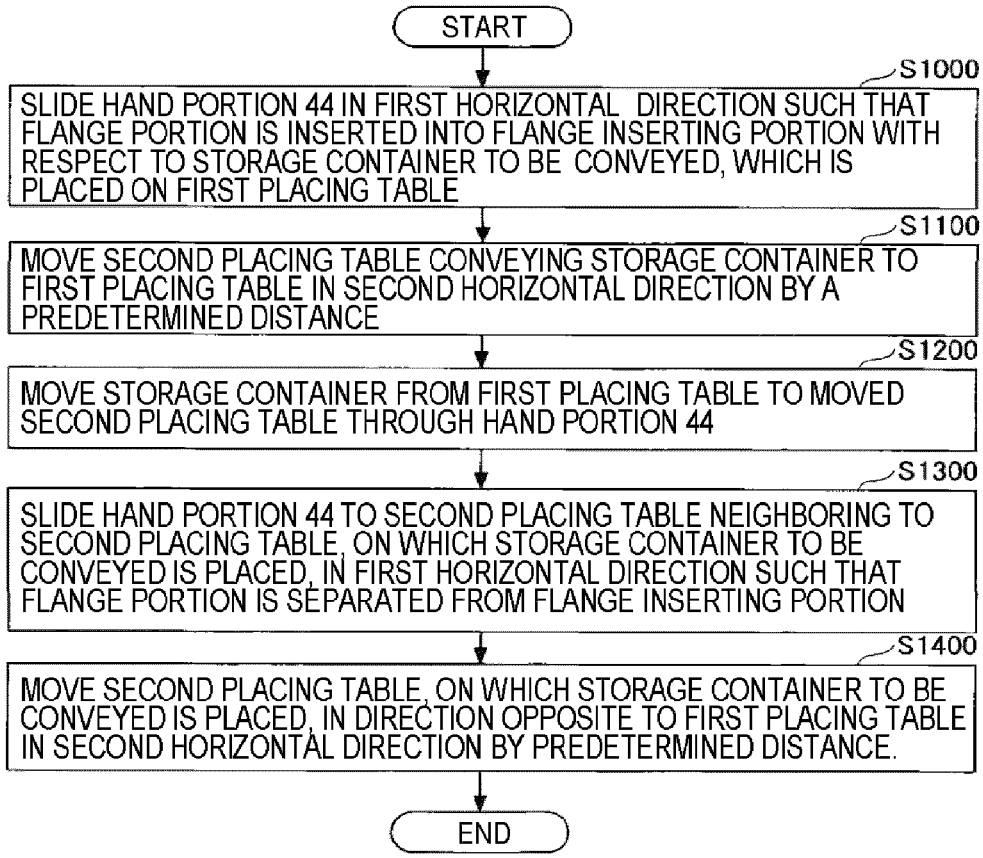

FIGS. 5A and 5B are flow charts of an exemplary conveying method according to an exemplary embodiment.

As illustrated in FIG. 5A, a conveying method according to an exemplary embodiment is a method of conveying wafers W during the carry-in thereof, that is, a method of conveying a storage container (e.g., the aforementioned FOUP) from a placing table to a conveyance place (e.g., the aforementioned FIMS port 24 or stocker 16) using the conveying mechanism 30 (e.g., the aforementioned carrier conveying mechanism 30) in the substrate processing apparatus 100, wherein the storage container is configured to hermetically store a substrate and includes the flange portion 40 formed on the top thereof, the conveying mechanism includes the hand portion 44 provided with the flange insertion portion 42, the substrate processing apparatus is provided with at least two placing tables (e.g., the aforementioned load ports 14) arranged side by side in a first horizontal direction (corresponding to the left-right direction) to be movable horizontally in a second horizontal direction (corresponding to the forward-backward direction) perpendicular to the first horizontal direction, and the conveyance place is provided to be spaced apart from the placing table in the second horizontal direction. The method comprising: a first step (S100) of moving the placing table, on which the storage container to be conveyed is placed, to the conveyance place in the second horizontal direction by a predetermined distance; a second step (S110) of sliding the hand portion from a side of a placing table neighboring to the placing table, on which the storage container to be conveyed is placed, in the first horizontal direction such that the flange portion is inserted into the flange inserting portion; and a third step (S120) of conveying the storage container from the placing table to the conveyance place through the hand portion.

As illustrated in FIG. 5B, a conveying method according to another exemplary embodiment is a method of conveying wafers W during the carry-in thereof, that is, a method of conveying a storage container from a first placing table (e.g., the aforementioned FIMS port 24 or stocker 16) to at least two second placing tables (e.g., the aforementioned load ports 14) using a conveying mechanism in the substrate processing apparatus 100, wherein the storage container is configured to hermetically store a substrate and includes the flange portion 40 formed on the top thereof, the conveying mechanism includes the hand portion 44 provided with the flange inserting portion 42, the at least two placing tables is arranged side by side in a first horizontal direction to be movable horizontally in a second horizontal direction perpendicular to the first horizontal direction, and the first placing table is provided to be spaced apart from the second placing tables in the second horizontal direction. The method comprising: a first step (S1000) of sliding the hand portion in the first horizontal direction such that the flange portion is inserted into the flange inserting portion with respect to a storage container to be conveyed, which is placed on the first placing table; a second step (S1100) of moving a second placing table conveying the storage container to the first placing table in the second horizontal direction by a predetermined distance; a third step (S1200) of moving the storage container from the first pacing table to the moved second placing table through the hand portion; a fourth step (S1300) of sliding the hand portion to a second placing table neighboring to the second placing table, on which the storage container to be conveyed is placed, in the first horizontal direction such that the flange portion is separated from the flange inserting portion; and a fifth step (S1300) of moving the second placing table, on which the storage container to be conveyed is placed, in a direction opposite to the first placing table in the second horizontal direction by the predetermined distance.

Detailed exemplary embodiments of the respective steps will be described with reference to FIGS. 6A to 6J, using the vertical heat treatment apparatus described with reference to FIGS. 1 to 3 as an example. However, the conveying method according to the exemplary embodiment may be applied to various other substrate processing apparatuses 100.

FIGS. 6A to 6J are schematic plan views illustrating a carrier conveying region for describing the conveying method according to the exemplary embodiment. Further, in FIG. 6A, for ease of understanding, the first horizontal direction and the second horizontal direction are illustrated and dotted lines in the respective figures indicate the locations of the carrier C in the previous figure.

Figure 6A:
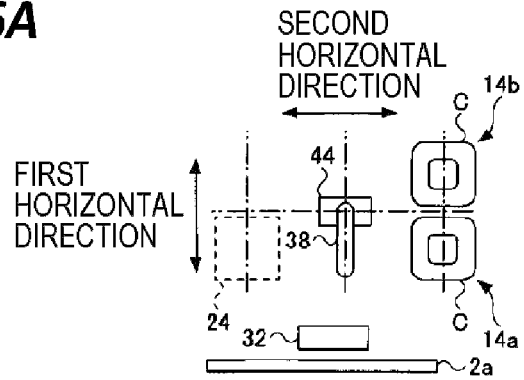
FIGS. 6A to 6J are schematic plan views illustrating a carrier conveying region for describing the conveying method according to the exemplary embodiment.

FIG. 6A illustrates an initial placement example of the hand portion 44 and the carrier C before carrying out the conveying method according to the exemplary embodiment. As an example of the description, it is assumed that two load ports 14 are arranged side by side in the first horizontal direction (the aforementioned left-right direction) and the carriers C are placed on two load ports 14.

The carrier conveying mechanism 30 includes the first guide unit 32 extending in the upward-downward direction as described above. The first guide portion 32 is inclined toward a side wall 2a of the case 2 so as to prevent interference of a conveyance path of the carrier C in conveying the carrier C in the second horizontal direction illustrated in FIG. 6A. In the exemplary embodiment, the load port 14 at the side wall 2a where the first guide portion 32 is placed is referred to as a first load port 14a and the other load port 14 is referred to as a second load port 14b. In addition, a case where the carrier C placed on the first load port 14a is conveyed to the FIMS port 24 will be exemplified below. However, the present disclosure is not limited thereto but may be applied even to a case where the carrier C placed on the first load port 14a is conveyed to the stocker 16.

Figure 6B:
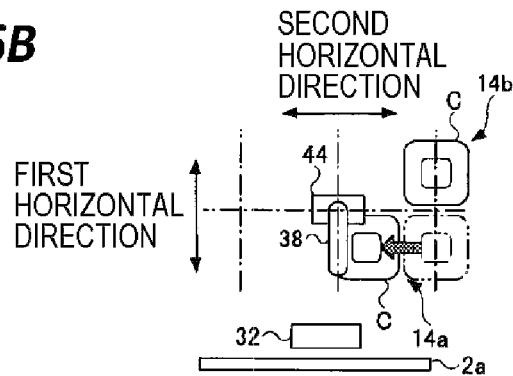

First, as a movement direction is indicated by an arrow of FIG. 6B, the first load port 14a in which the carrier C is placed is moved to the FIMS port 24 in the second horizontal direction by a predetermined distance (S100).

A movement distance of the first load port 14a may be a distance not to intrude on an exclusion region of a SEMI specification regarding the second load port 14b when the hand portion 44 of the carrier conveying mechanism 30 conveys the carrier C on the first load port 14a, and may be, for example, a width which is as large as one carrier C as illustrated in FIG. 6B.

Figure 6C:
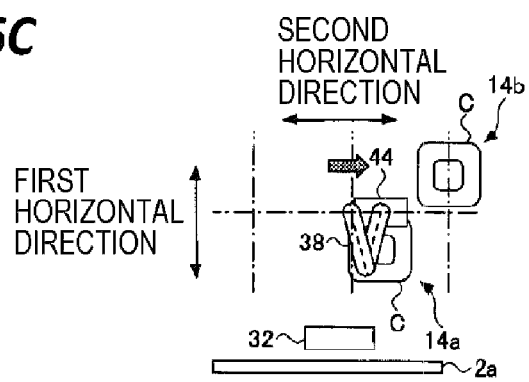

Next, as the movement direction is indicated by an arrow of FIG. 6C, the height of the hand portion 44 is adjusted such that the heights of the flange inserting portion 42 (see FIG. 1) of the hand portion 44 and the flange portion 40 of the carrier C correspond to each other and the hand portion 44 is moved toward the second load port 14b in the first horizontal direction with respect to the flange portion 40 of the carrier C placed in the first load port 14a. When the hand portion 44 is moved to an opposite side to the second load port 14b in the first horizontal direction with respect to the flange portion 40 of the carrier C placed in the first load port 14a, the arm portion 38 may interfere with the side wall 2a of the case 2 or the first guide portion 32. The interference may be avoided by increasing the size of the case 2, but it is undesirable in that a footprint of the substrate processing apparatus 100 is increased in this case.

Figure 6D:
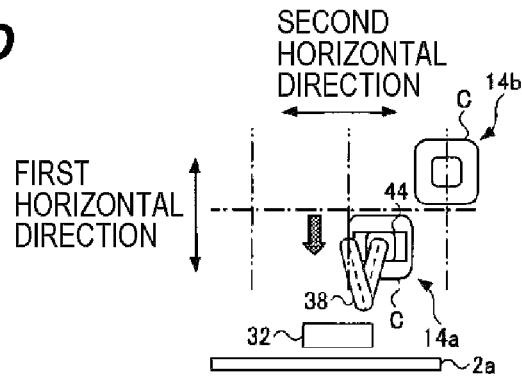
Figure 6E:
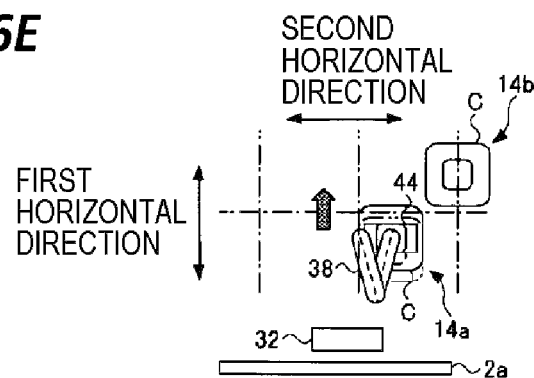

In addition, as the movement direction is indicated by an arrow of FIG. 6D, the hand portion 44 is slidably moved such that the flange portion 40 is inserted into the flange inserting portion 42 (S110). Further, as described above, components that make the flange portion 40 of the carrier C and the hand portion 44 be easily aligned with each other may be provided at the flange portion 40 of the carrier C and the hand portion 44.

Next, the hook 28 for the carrier C of the load port 14 is released and thereafter, the hand portion 44 is lifted to release the carrier C from the first load port 14a. In this case, the engaging portion 48 of the hand portion 44 supports the bottom surface of the flange portion 40, so that the carrier C is engaged on the hand portion 44. Thereafter, preferably, the carrier C is slid to the second load port 14b in the first horizontal direction by a predetermined distance (see a movement direction indicated by an arrow of FIG. 6E). As described above, the arm portion 38 of the carrier conveying mechanism 30 may interfere with the side wall 2a of the case 2 or the first guide portion 32. However, the hand portion 44 is slidably moved from the load port 14 (the first load port 14a) placing a carrier to be conveyed to a neighboring load port 14 (the second load port 14b) by a predetermined distance to prevent the interference even in a case where the footprint of the substrate processing apparatus 100 is small (see FIG. 6F).

Figure 6F:
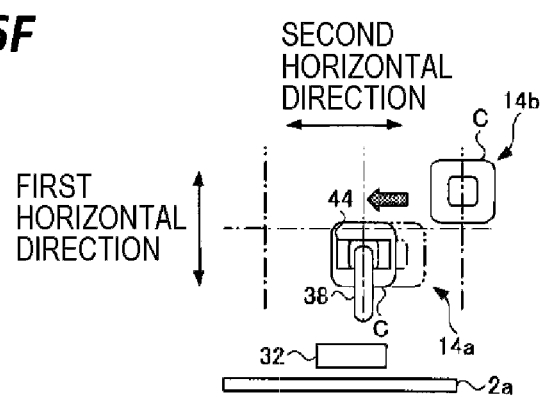
Figure 6G:
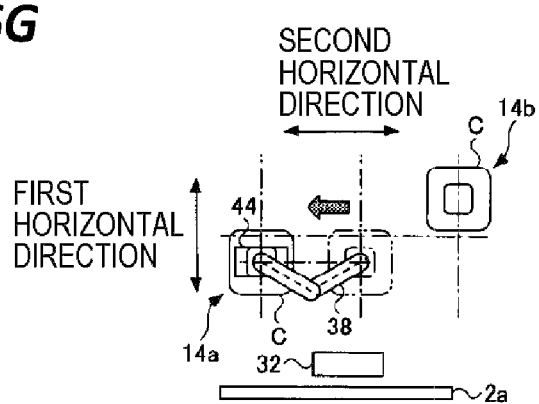
Figure 6H:
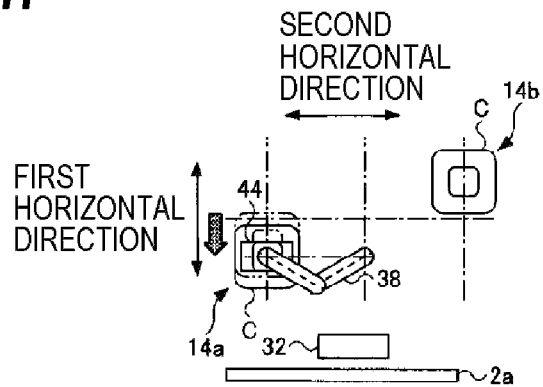

In addition, as the movement direction is indicated by arrows of FIGS. 6F and 6G, the hand portion 44 supporting the carrier C is conveyed from the load port 14 in the second horizontal direction to a conveyance place (FIMS port 24 or stocker 16 or FIMS port 24 in the example illustrated in FIGS. 6A to 6J). Next, as the movement direction is indicated by an arrow of FIG. 6H, the hand portion 44 supporting the carrier C is moved from the second load port 14b in the first horizontal direction to the first load port 14a to be moved upwards of the FIMS port 24 and the hand port 44 moves down to deploy the carrier C on the FIMS port 24.

Figure 6I:
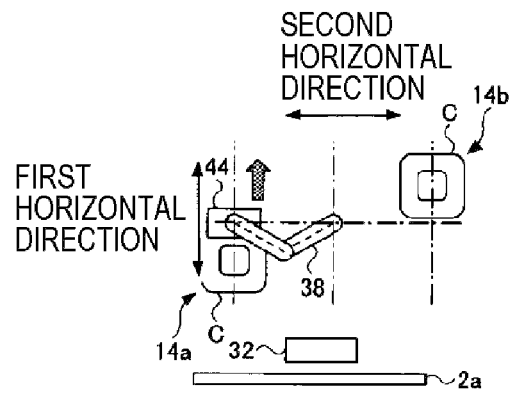
Figure 6J:
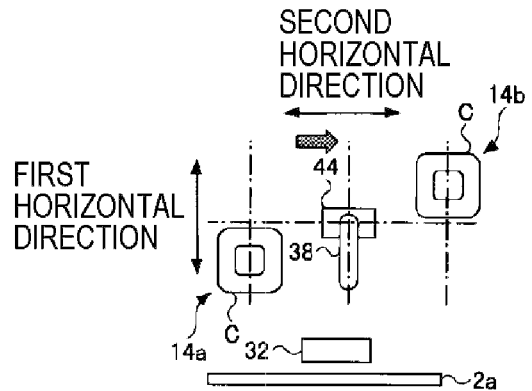

After the carrier C is fixed by the hook 28 (see FIG. 2) of the FIMS port 24, the hand portion 44 is slidably moved from the first load port 14a in the first horizontal direction to the second load port 14b by a predetermined distance as the movement direction is indicated by an arrow of FIG. 6I to release the engagement of the flange portion 40 by the hand portion 44. Last, the hand portion 44 is restored to an initial location and conveyance of the carrier C when carrying the wafer W in is completed.

Further, conveyance of the carrier C when carrying the wafer W out will be described with reference to FIGS. 7A to 7J.

FIGS. 7A to 7J are schematic plan views illustrating a carrier conveying region for describing a conveying method according to another exemplary embodiment. Further, in FIG. 7A, for ease of understanding, the first horizontal direction and the second horizontal direction are illustrated and dotted lines in FIGS. 7A to 7F indicate the locations of the first load port 14a. Further, since the conveyance of the carrier C when carrying the wafer W out is primarily performed by an operation opposite to FIGS. 6A to 6J, the respective components are described by using the same components as those in FIGS. 6A to 6J.

Figure 7A:
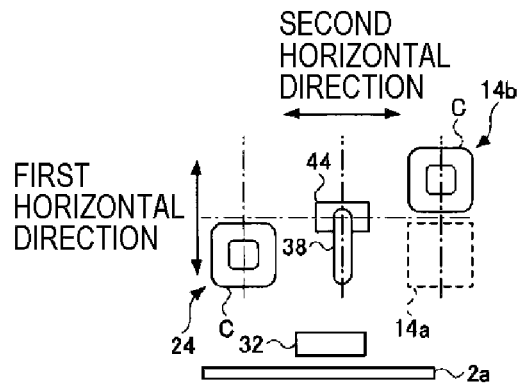
FIGS. 7A to 7J are schematic plan views illustrating a carrier conveying region for describing a conveying method according to another exemplary embodiment.

FIG. 7A illustrates an initial placement example of the hand portion 44 and the carrier C before performing the conveying method according to the exemplary embodiment. As an example, descriptions will be made on a case where two load ports 14a and 14b are arranged side by side in the first horizontal direction, the second load port 14b, the FIMS port 24 (the stocker 16 may be used), and the carrier C are placed, and the carrier C on the FIMS port 24 is conveyed to the first load port 14a.

Figure 7B:
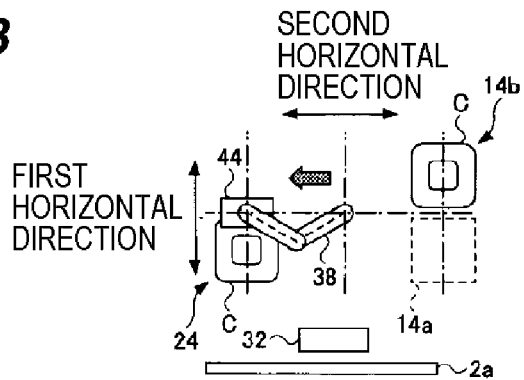

First, as the movement direction is indicated by an arrow of FIG. 7B, the hand portion 44 is moved to the FIMS port 24. In this case, the height of the had portion 44 is adjusted such that the heights of the flange inserting portion 42 (see FIG. 1) of the hand portion 44 and the flange portion 40 of the carrier C correspond to each other and the hand portion 44 is spaced apart from the flange portion 40 of the carrier C placed on the FIMS port 24 in the first horizontal direction by a predetermined distance.

Figure 7C:
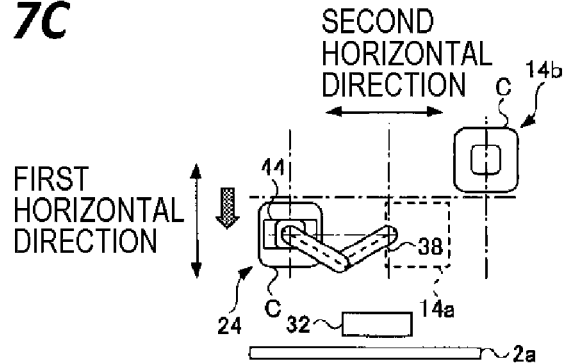
Figure 7D:
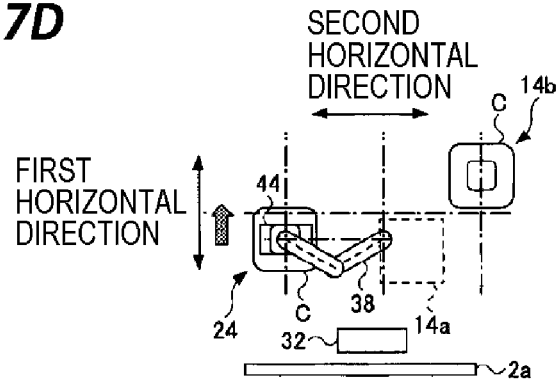

Next, as the movement direction is indicated by an arrow of FIG. 7C, the hand portion 44 is slidably moved such that the flange portion 40 is inserted into the flange inserting portion 42 (S1000). Further, in this case, the first load port 14a is moved to the FIMS port 24 in the second horizontal direction by a predetermined distance (S1100).

The movement distance of the first load port 14a may be the distance not to intrude on the exclusion region of the SEMI specification regarding the second load port 14b when the hand portion 44 of the carrier conveying mechanism 30 places the carrier C on the first load port 14a in FIGS. 7F and 7G (to be described below) and may be, for example, the width as large as one carrier C as illustrated in FIG. 6C.

Next, the hook 28 for the carrier C of the FIMS port 24 is released and thereafter, the hand portion 44 is lifted to release the carrier C from the FIMS port 24. In this case, the engaging portion 48 of the hand portion 44 supports the bottom surface of the flange portion 40, and as a result, the carrier C is engaged on the hand portion 44. Thereafter, preferably, the carrier C is slid to the second load port 14b in the first horizontal direction by a predetermined distance (see a movement direction indicated by an arrow of FIG. 7D). As described above, the arm portion 38 of the carrier conveying mechanism 30 may interfere with the side wall 2a of the case 2 or the first guide portion 32. However, the hand portion 44 is slidably moved from the load port 14 (the first load port 14a), on which a carrier to be conveyed is placed, to the neighboring load port 14 (the second load port 14b) by a predetermined distance to prevent the interference even in a case where the footprint of the substrate processing apparatus 100 is small.

Figure 7E:
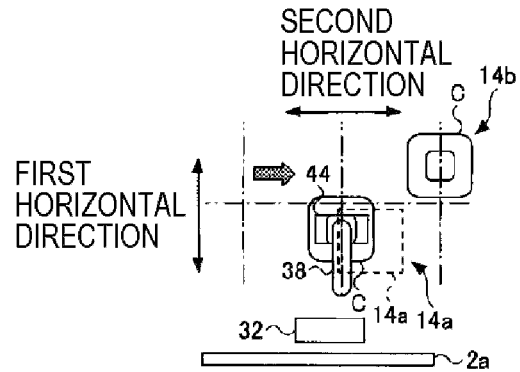
Figure 7F:
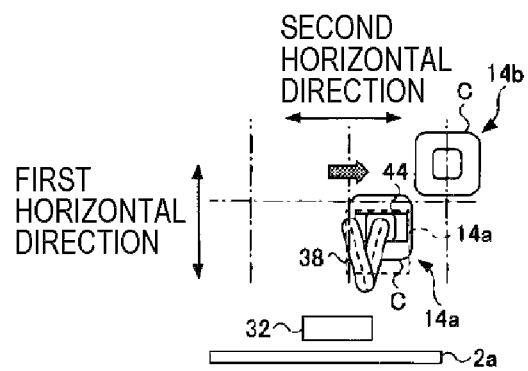
Figure 7G:
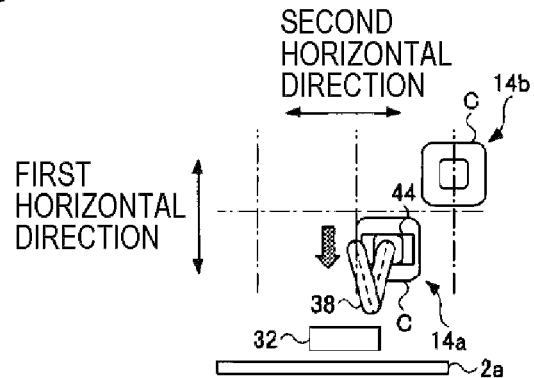

In addition, as the movement direction is indicated by arrows of FIGS. 7E and 7F, the hand portion 44 supporting the carrier C is conveyed from the FIMS port 24 in the second horizontal direction to the first load port 14a (S1200). Next, as the movement direction is indicated by an arrow of FIG. 7G, the hand portion 44 supporting the carrier C is moved from the second load port 14b in the first horizontal direction to the first load port 14a to be moved upwards of the first load port 14a and the hand portion 44 moves down to deploy the carrier C on the first load port 14a.

Figure 7H:
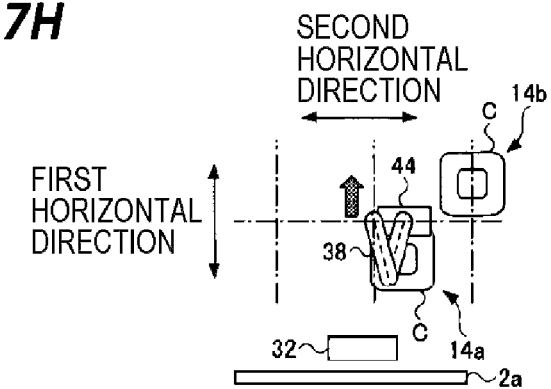
Figure 7I:
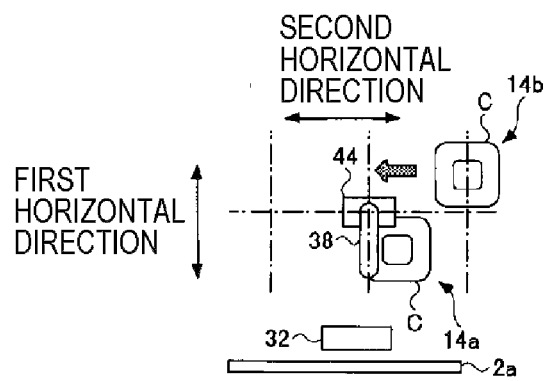
Figure 7J:
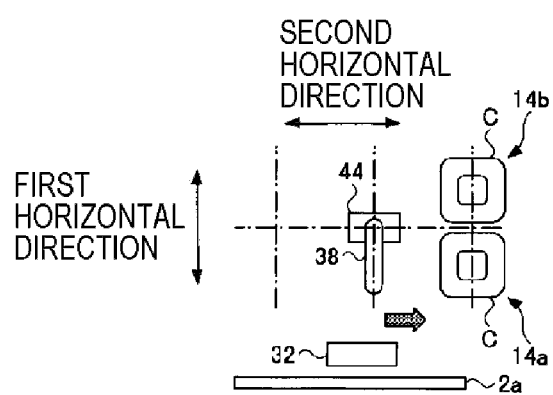

After the carrier C is fixed by the hook 28 of the first load port 14a, the hand portion 44 is slidably moved from the first load port 14a in the first horizontal direction to the second load port 14b by a predetermined distance as the movement direction is indicated by an arrow of FIG. 7H (S1300). As a result, the flange portion is separated from the flange inserting portion 42 to be removed. In addition, as illustrated in FIGS. 7I and 7J, the hand portion 44 is restored to the initial location, the first load port 14a is moved in the second horizontal direction to be restored to the initial location, and the conveyance of the carrier C when the carrying the wafer W out is completed.

Hereinabove, in the conveying method according to the exemplary embodiment, by using the conveying mechanism including the hand portion 42 with the flange inserting portion 42, the hand portion 44 is slidably moved in the horizontal direction such that the flange portion 40 is inserted into the flange inserting portion 42 and the carrier is conveyed by lifting the flange portion 40 while engaging the flange portion 40. As a result, since the number of components required for the hand portion 44 may be decreased, the hand portion 44 is light-weight and bending of the arm portion 38 in conveyance may be suppressed. Further, in the conveying method according to the exemplary embodiment, a placing table placing the carrier C to be conveyed is moved to the conveyance place, before conveying the carrier C. Therefore, when the flange portion 40 is inserted into the flange inserting portion 42 by slidably moving the hand portion 44, the hand portion 44 may be prevented from intruding on the exclusion region of the SEMI specification regarding the second load port 14b. As a result, in the conveying method according to the exemplary embodiment, the carrier C storing the substrate may be certainly conveyed by the light-weight carrier conveying mechanism 30.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of conveying a storage container from a placing table to a conveyance place using a conveying mechanism in a substrate processing apparatus, wherein the storage container is configured to hermetically store a substrate and includes a flange portion formed on the top thereof, the conveying mechanism includes a hand portion provided with a flange insertion portion, the substrate processing apparatus includes at least two placing tables arranged side by side in a first horizontal direction to be movable horizontally in a second horizontal direction perpendicular to the first horizontal direction, and the conveyance place is provided to be spaced apart from the placing table in the second horizontal direction, the method comprising:

first moving including moving the placing table, on which the storage container to be conveyed is placed, towards the conveyance place in the second horizontal direction by a predetermined distance inside the substrate processing apparatus;

sliding, after the first moving, the hand portion from a side of a placing table neighboring towards the placing table with the storage container placed thereon in the first horizontal direction such that the flange portion is inserted into the flange inserting portion; and conveying, after the sliding, the storage container from the placing table to the conveyance place through the hand portion, wherein the conveying includes second moving including moving, after the sliding, the storage container upwards from the placing table by lifting the hand portion perpendicular to the first and second directions, third moving including moving, after the second moving, the hand portion from the placing table towards the neighboring placing table by a predetermined distance in the first horizontal direction, fourth moving including moving, after the third moving, the hand portion supporting the storage container from the placing table to the conveyance place in the second horizontal direction, fifth moving including moving, after the fourth moving, the hand portion away from the neighboring placing table by the predetermined distance in the first horizontal direction, and sixth moving including moving, after the fifth moving, the storage container downwards by lowering the hand portion to deploy the storage container on the conveyance place perpendicular to the first and second directions.

2. The method of claim 1, wherein the hand portion includes, on the bottom thereof, an engagement unit configured to engage with a bottom of the inserted flange portion.

3. The method of claim 1, wherein the substrate processing apparatus includes:
- a substrate conveying region and a container conveying region which are partitioned by a partition wall having one or more conveyance ports in the first horizontal direction;
- a holding table provided to correspond to the conveyance ports in the container conveying region and configured to hold the storage container to deliver the substrate stored in the storage container from the container conveying region to the substrate conveying region through the conveyance ports; and
- a storage shelf provided above the holding table and configured to store the storage container.

4. The method of claim 3, wherein the conveyance place is any one of the holding table and the storage shelf.

5. The method of claim 3, wherein the storage container includes a positioning groove on the bottom, and
- the placing table, the holding table, and the storage shelf include a positioning pin that engages with the positioning groove.

6. The method of claim 1, wherein the conveying mechanism includes:
- a first guide portion provided between the conveyance place and the placing table and extending in a vertical direction;
- a second guide portion connected to the first guide portion to be movable in the vertical direction and extending in the first horizontal direction;
- a moving portion connected to the second guide portion to be movable in the first horizontal direction; and
- an arm portion provided in the moving portion, and
- the hand portion is provided at a front end of the arm portion.

7. A substrate processing apparatus comprising:
- a substrate conveying region and a container conveying region which are partitioned by a partition wall having one or more conveyance ports in a first horizontal direction;
- a holding table provided to correspond to the conveyance ports in the container conveying region and configured to hold a storage container which hermetically stores a substrate and has a flange portion on the top thereof to deliver the substrate stored in the storage container from the container conveying region to the substrate conveying region through the conveyance ports;
- a storage shelf provided above the holding table and configured to store the storage container;
- at least two placing tables provided in the container conveying region spaced apart from each other in line in a first horizontal direction and a second horizontal direction perpendicular to a vertical direction and arranged side by side at least in the first horizontal direction to be movable horizontally to the holding table;
- a conveying mechanism including
  - a first guide portion provided between the holding table and the placing table and extending in a vertical direction,
  - a second guide portion connected to the first guide portion to be movable in the vertical direction and extending in the first horizontal direction,
  - a moving portion connected to the second guide portion to be movable in the first horizontal direction,
  - an arm portion provided in the moving portion and stretchable in the second horizontal direction, and
  - a hand portion provided at a front end of the arm portion and having a flange inserting portion; and
- a control unit configured to control operations of the conveying mechanism, wherein the control unit is configured to control the conveying mechanism
  - to move the placing table, on which the storage container to be conveyed is placed, towards the holding table in the second horizontal direction by a predetermined distance inside the substrate processing apparatus,
  - to slide, after moving the placing table, the hand portion from a side of a placing table neighboring towards the placing table with the storage container placed thereon in the first horizontal direction such that the flange portion is inserted into the flange inserting portion, and
  - to convey, after sliding the hand portion, the storage container from the placing table to the holding table or the storage shelf through the hand portion, wherein
- upon conveying the storage container from the placing table to the holding table or the storage shelf, the control unit is further configured to control the conveying mechanism
  - to move, after sliding the hand portion, the storage container upwards from the placing table by lifting the hand portion perpendicular to the first and the second directions,
  - to move, after moving the storage container, the hand portion from the placing table towards the neighboring placing table by a predetermined distance in the first horizontal direction,
  - to move, after moving the hand portion towards the neighboring placing table, the hand portion supporting the storage container from the placing table to the holding table or the storage shelf in the second horizontal direction,
  - to move, after moving the hand portion supporting the storage container, the hand portion away from the neighboring placing table by the predetermined distance in the first horizontal direction, and
  - to move, after moving the storage container away from the neighboring placing table, the storage container downwards by lowering the hand portion to deploy the storage container on the holding table or the storage shelf perpendicular to the first and second directions.

* * * * *